(12) United States Patent
Kwok

(10) Patent No.: US 10,804,935 B2
(45) Date of Patent: Oct. 13, 2020

(54) TECHNIQUES FOR REDUCING LATENCY IN THE DETECTION OF UNCORRECTABLE CODEWORDS

(71) Applicant: Intel Corporation, Santa Clara, CA (US)

(72) Inventor: Zion S. Kwok, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 15/860,513

(22) Filed: Jan. 2, 2018

(65) Prior Publication Data

US 2019/0044541 A1 Feb. 7, 2019

(51) Int. Cl.
| | |
|---|---|
| *H03M 13/00* | (2006.01) |
| *G11C 29/00* | (2006.01) |
| *H03M 13/15* | (2006.01) |
| *H03M 13/37* | (2006.01) |

(52) U.S. Cl.
CPC ..... *H03M 13/1545* (2013.01); *H03M 13/152* (2013.01); *H03M 13/153* (2013.01); *H03M 13/1515* (2013.01); *H03M 13/1575* (2013.01); *H03M 13/3738* (2013.01); *H03M 13/3746* (2013.01); *H03M 13/617* (2013.01); *H03M 13/6502* (2013.01)

(58) Field of Classification Search
CPC ......... H03M 13/1545; H03M 13/1515; H03M 13/152; H03M 13/153; H03M 13/1575; H03M 13/3738; H03M 13/3746; H03M 13/617; H03M 13/6502
USPC ....... 714/764, 781, 782, 784, 785, 800, 807, 714/752, 758
See application file for complete search history.

(56) References Cited

U.S. PATENT DOCUMENTS

| | | | |
|---|---|---|---|
| 2008/0168335 A1* | 7/2008 | Mead ................ | H03M 13/1515 714/784 |
| 2012/0240013 A1* | 9/2012 | Wong .................. | H03M 13/152 714/782 |
| 2018/0034481 A1* | 2/2018 | Garani ................ | H03M 13/353 |
| 2018/0060160 A1* | 3/2018 | Fang ................. | H03M 13/1525 |
| 2018/0212625 A1* | 7/2018 | Brueggen ......... | H03M 13/1515 |

* cited by examiner

*Primary Examiner* — Christine T. Tu
(74) *Attorney, Agent, or Firm* — Compass IP Law PC

(57) ABSTRACT

Devices, systems, and methods that reduce the latency of detecting that a codeword is uncorrectable are disclosed and described. Such devices, systems, and methods allow the determination that a codeword is uncorrectable prior to determining error locations in the codeword, thus eliminating the need for such an error location search.

24 Claims, 5 Drawing Sheets

TECHNIQUES FOR REDUCING LATENCY IN THE DETECTION OF UNCORRECTABLE CODEWORDS

BACKGROUND

Computing device readable media, such as floating gate memory, Phase Change Memory (PCM), SSD based on floating gate memory or PCM, and the like, utilize error correction algorithms to detect and correct errors that occur during operation. Errors can be caused by a number of sources, such as random noise, cell-to-cell interference, read or write disturb, programming error, retention errors, charge leakage and trapping generation, to name a few.

BRIEF DESCRIPTION OF THE DRAWINGS

Features and advantages of the disclosure will be apparent front the detailed description which follows, taken in conjunction with the accompanying drawings, which together illustrate, by way of example, features of the disclosure; and, wherein.

DESCRIPTION OF EMBODIMENTS

Figure 1:
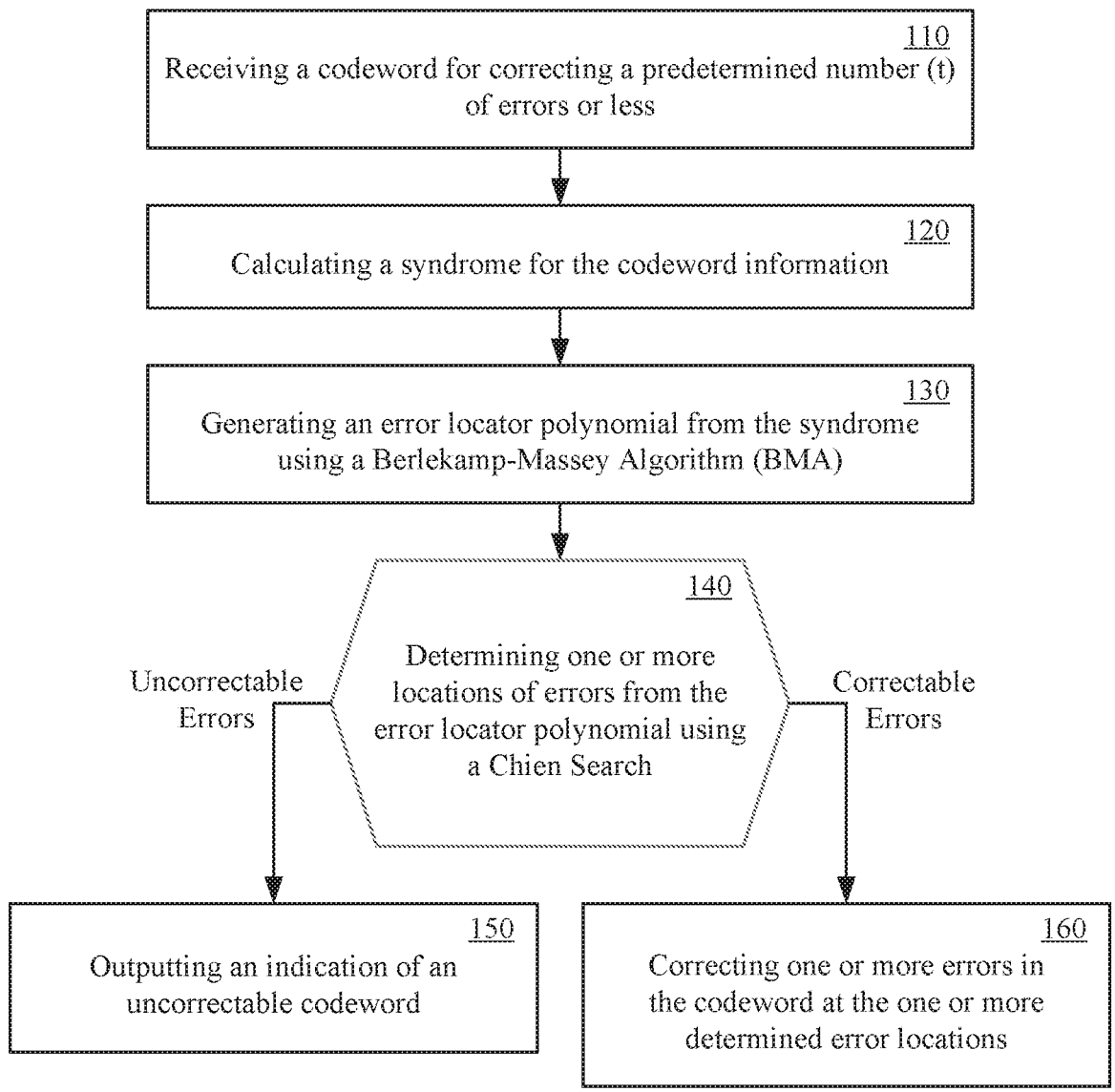
FIG. 1 is a flow diagram illustrating a method of reducing detection latency of uncorrectable errors in read data in accordance with an example.

Before embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to convey a thorough understanding of various embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a" includes a plurality of such.

Reference throughout this specification to "an example" means that a particular feature, structure, or characteristic described in connection with the example is included in one or more embodiments. Thus, appearances of the phrases "in an example" or "in an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law, "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open-ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood, that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

As used herein, the term "circuitry" can refer to, be part of, or include an Application Specific integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects, the circuitry can be implemented in, or functions associated with the circuitry can be implemented by, one or more software or firmware modules. In some aspects, circuitry can include logic, at least partially operable in hardware.

Various techniques, or certain aspects or portions thereof, may take the form of program code (i.e., instructions) embodied in tangible media, such as floppy diskettes, compact disc-read-only memory (CD-ROMs), hard drives, transitory or non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), an input device, and an output device. The volatile and non-volatile memory and/or storage elements may be a random-access memory (RAM), erasable programmable read only memory (EPROM), flash drive, optical drive, magnetic hard drive, solid state drive, or other medium for storing electronic data. The node and wireless device may also include a transceiver module (i.e., transceiver), a counter module (i.e., counter), a processing module (i.e., processor), and/or a clock module (i.e., clock) or timer module (i.e., timer). One or more programs that may implement or utilize the various techniques described herein may use an application programming interface (API), reusable controls, and the like. Such programs may be implemented in a high-level procedural or object-oriented programming language to communicate with a computer system. However, the program(s) may be implemented in assembly or machine language, if desired. In any case, the language may be a compiled or interpreted language, and combined with hardware implementations.

As used herein, the term "processor" can include general purpose processors, specialized processors such as central processing units (CPUs), graphics processing units (GPUs), digital signal processors (DSPs), microcontrollers (MCUs), embedded controller (ECs), field programmable gate arrays (FPGAs), or other types of specialized processors, as well as base band processors used in transceivers to send, receive, and process wireless communications.

It should be understood that many of the functional units described in this specification may have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module may not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" or "exemplary" means that a particular feature, structure, or characteristic described in connection with the example is included in one or more embodiments of the present technology. Thus, appearances of the phrases "in an example" or "in an embodiment" or the word "exemplary" in various places throughout this specification are not necessarily all referring to the same embodiment.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Error correction codes (ECC) are an integral part of conventional memory devices, and techniques utilizing ECC can be used to correct bit errors that are typically introduced when reading from or writing to memory. ECC encoding techniques can be used to add redundancy to data bits to form a codeword for storage in a memory, and ECC decoding techniques can then use the codeword to detect and correct errors therein.

FIG. 1 shows one example of a traditional method of correcting errors in read data, which can include receiving a codeword for correcting a predetermined number (t) of errors or less 110. Nonlimiting examples of codewords can include a Bose-Chaudhure-Hocquenghem (BCH) codeword, a Reed-Solomon codeword, or the like. A syndrome can be calculated for a BCH codeword or a plurality of partial syndromes can be calculated for the Reed-Solomon code word 120. An error locator polynomial can be generated from the syndrome for the BCH codeword or the plurality of partial syndromes of the Reed-Solomon codeword 130. If one or more errors are detected, a Chien Search can then be performed on the error locator polynomial to determine the number and location of errors 140. If it is determined from the Chien Search that the codeword is uncorrectable, an appropriate indication can be output 150. Otherwise the errors at the locations determined by the Chien Search from the error locator polynomial can be corrected 160. This error detection method can be computationally intensive, and can result in an increase in data read latency, particularly the Chien Search-determination of error locations.

In one example, error detection and correction latency can be reduced by detecting that a codeword is uncorrectable from an error locator polynomial prior to determining the location of the errors from the error locator polynomial. In other words, if it is determined that a codeword is uncorrectable, there is no need to determine the location of the errors, and error correction latency is decreased by avoiding the now-unnecessary Chien Search step. In one example, a Bose-Chaudhure-Hocquenghem (BCH) codeword can be determined to be uncorrectable when the error locator polynomial indicates that the codeword includes a predetermined number (t) of errors or less. In another example, a Reed-Solomon codeword can be determined to be uncorrectable when a final discrepancy for the error locator polynomial is a non-zero value. When a codeword is determined to be uncorrectable, a computationally intensive Chien Search of the error locator polynomial can then be skipped.

Figure 2:
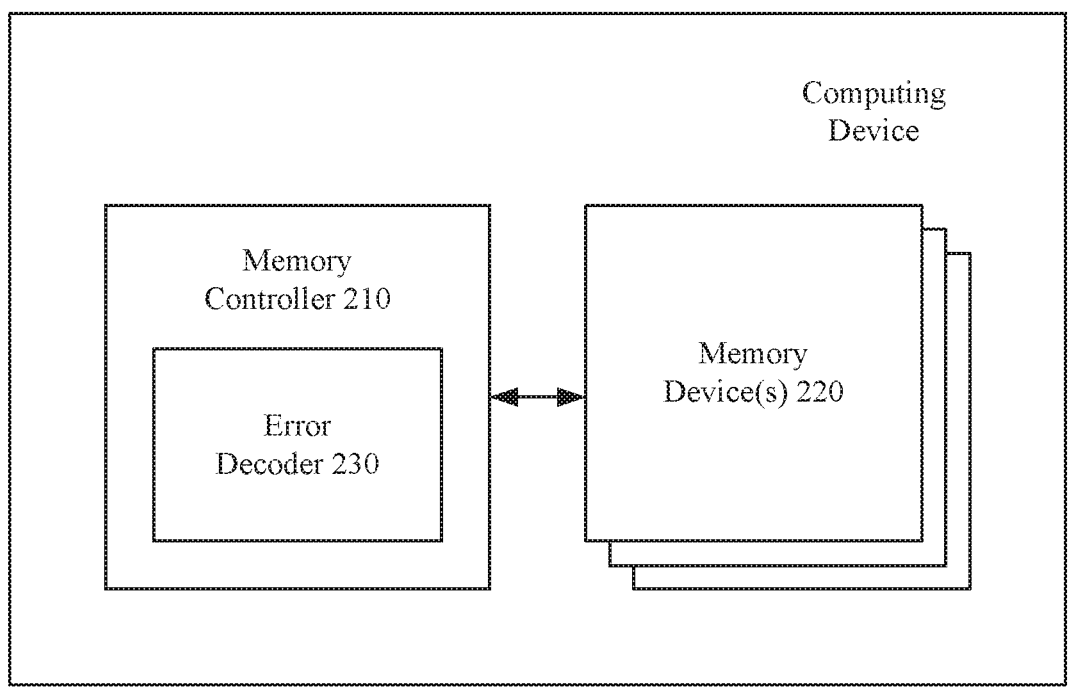
FIG. 2 is a block diagram illustrating one or more memory devices and a memory controller in accordance with an example.

FIG. 2 shows a simplified example of one or more memory devices 220 and a memory controller 210. The memory controller 210 can control read, write, and erase operations for the one or more memory devices 220. The memory controller 220 can include an error decoder 230 and other sub-circuits that are not necessary for an understanding of the present technology, and therefore are not discussed herein. The error decoder 230 can receive codeword from the memory 220 in response to the read commands, and decodes the user data from the received codeword.

The memory device 220 can utilize non-volatile memory (NVM), which can include Single Level Cell (SLC) or Multi-Level Cell (MLC) memory. NVM is a storage medium that does not require power to maintain the state of data stored by the medium. Nonlimiting examples of NVM can include planar or three-dimensional (3D) NAND flash memory, including single or multi-threshold-level NAND flash memory, NOR flash memory, single or multi-level Phase Change Memory (PCM), such as chalcogenide glass PCM, planar or 3D PCM, cross-point array memory, including 3D cross-point memory, non-volatile dual in-line memory module (NVDIMM)-based memory, such as flash-based (NVDIMM-F) memory, flash/DRAM-based (NVDIMM-N) memory, persistent memory-based (NVDIMM-P) memory, 3D cross-point-based NVDIMM memory, resistive RAM (ReRAM), including metal-oxide- or oxygen vacancy-based ReRAM, such as $HfO_2$—, $Hf/HfO_x$—, $Ti/HfO_2$—, $TiO_x$—, and $TaO_x$-based ReRAM, filament-based ReRAM, such as $Ag/GeS_2$—, $ZrTe/Al_2O_3$—, and Ag-based ReRAM, programmable metallization cell (PMC) memory, such as conductive-bridging RAM (CBRAM), silicon-oxide-nitride-oxide-silicon (SONOS) memory, ferroelectric RAM (FeRAM), ferroelectric transistor RAMI (Fe-TRAM), anti-ferroelectric memory, polymer memory (e.g., ferroelectric polymer memory), magnetoresistive RAM (MRAM), write-in-place non-volatile MRAM (NVMRAM), spin-transfer torque (STT) memory, spin-orbit torque (SOT) memory, nanowire memory, electrically erasable programmable read-only memory (EEPROM), nanotube RAM (NRAM), other memristor- and thyristor-based memory, spintronic magnetic junction-based memory, magnetic tunneling junction (MTJ)-based memory, domain wall (DW)-based memory, and the like, including combinations thereof. The term "memory device" can refer to the die itself and/or to a packaged memory product. NVM can be byte or block addressable. In some examples, NVM can comply with one or more standards promulgated by the Joint Electron Device Engineering Council (JEDEC), such as JESD21-C, JESD218, JESD219, JESD220-1, JESD223B, JESD223-1, or other suitable standard (the JEDEC standards cited herein are available at www.jedec.org). In one specific example, the NVM can be 3D cross-point memory.

Figure 3:
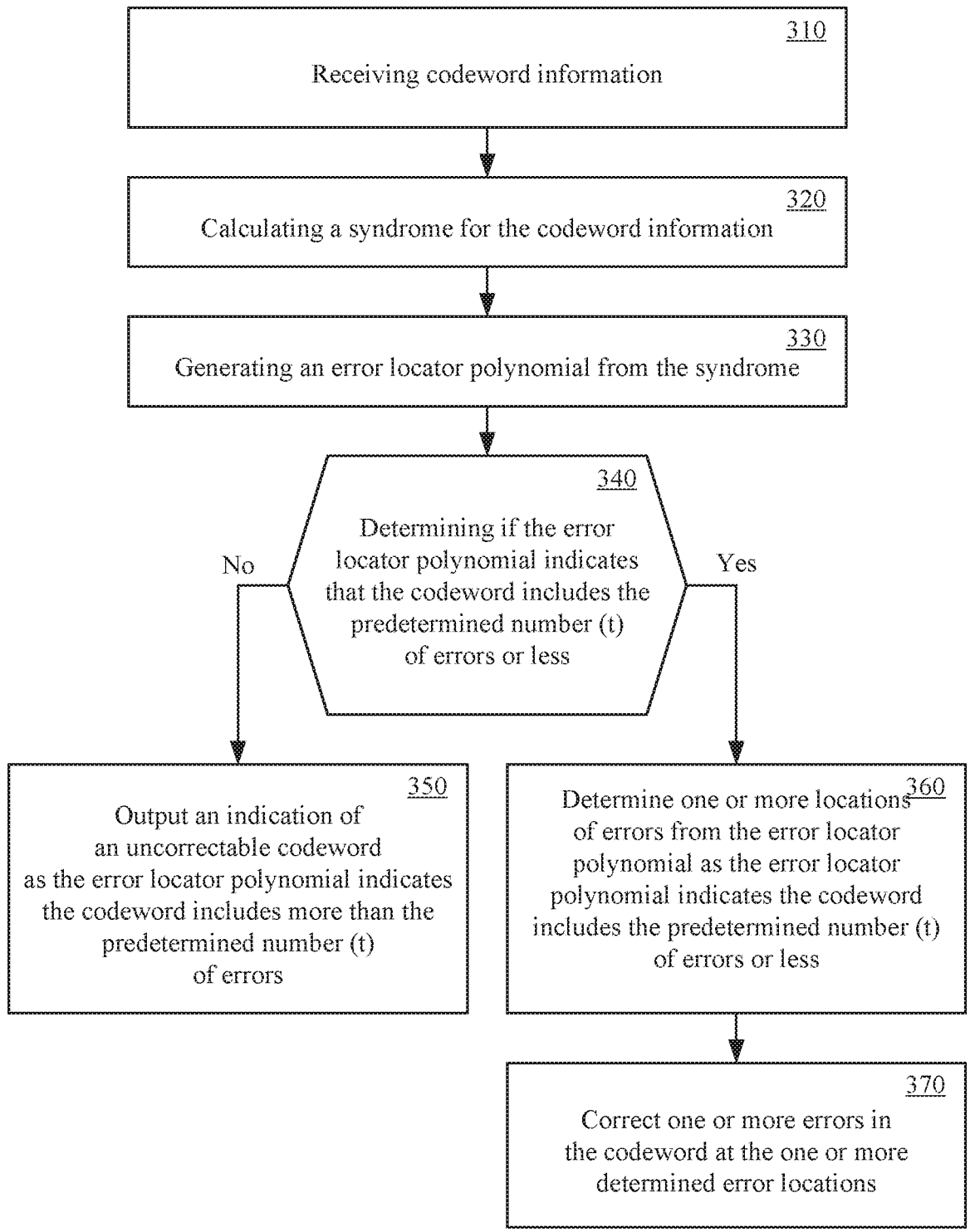
FIG. 3 is a flow diagram illustrating a method of reducing detection latency of uncorrectable errors in read data in accordance with an example.

FIG. 3 is a flow diagram illustrating an example of correcting errors in read data. In one aspect, codeword can be received 310 at the memory controller 210. In one implementation the codeword can be a Bose-Chaudhure-Hocquenghem (BCH) codeword for correcting the predetermined number (t) of errors or less. Once received, a syndrome for the codeword can be calculated 320 by the error decoder 230, and an error locator polynomial can be generated for the syndrome 330. In one implementation the error locator polynomial can be generated using a Berlekamp-Massey Algorithm (BMA) on the syndrome.

Once generated, a determination is made as to whether the error locator polynomial indicates that the codeword includes the predetermined number (t) of errors or less 340. In other words, the determination is made as to whether the error locator polynomial indicates that the codeword includes less than or equal to t errors. In one example, the number of errors can be determined from the degree of the error locator polynomial. If the error locator polynomial indicates that the codeword includes more than the predetermined number (t) of errors, an indication of an uncorrectable codeword can be output 350 to the requester of the data. If the error locator polynomial indicates that the codeword includes the predetermined number (t) of errors or less, the error decoder 230 can continue with the error correction algorithm. For example, the error decoder 230 can determine one or more locations of errors from the error location polynomial 360. In one implementation, determining the error locations can include determining the roots of the error locator polynomial using a Chien Search. The errors in the codeword can then be corrected at one or more error locations 370.

It should be noted that even if the degree of the error locator polynomial is less than or equal to t errors, the BCH codeword may still be uncorrectable. However, the probability of such is equal to the probability that a random last discrepancy in the BMA is equal to 0. For a Galois Field (GF) of $2^m$, the probability of an uncorrectable error having an error locator polynomial with degree less than or equal to t is $2^{-m}$. For m=9, 99.8% of uncorrectable codewords can be detected by checking the polynomial degree. Given this low probability, any increase in latency overhead due to performing the Chien Search is likely to be negligible.

The method of reducing detection latency of uncorrectable errors in read data will be further described referencing both FIGS. 2 and 3. In response to a read command received from the memory controller 210, the memory device 220 detects the bit values of the memory cells associated with the read command. In some examples, the bit values of the memory cells can be sensed using a Demarcation Voltage (Vdm). In the example of 3D cross point memory, for example, Vdm is generally intended to be a voltage that falls between the distribution voltages of two states of a memory cell. The distribution voltages of the states of the memory cell, however, will typically shift based upon operating parameters such as operating supply voltage, operating temperature, memory cell wear, voltage drift, and the like. This shift is one reason for the errors that can occur in data retrieved from the memory. Upon the detection of errors, a number of steps can be taken, including reprogramming memory cells, adjusting the Vdm for affected memory cells, and the like.

Once read out, the memory device 220 can send a first instance of the codeword to the memory controller 210. In one instance, the codeword can be a Bose-Chaudhure-Hocquenghem (BCH) codeword. For example, the BCH codeword can be used for correcting up to 27 errors in a 1K byte codeword. The error decoder 230 of the memory controller 210 can receive the first instance of the codeword 310 and can calculate a first syndrome of the first instance of the codeword 320. In one instance, the first syndrome can be calculated for the first instance of a BCH codeword. The error decoder 230 can also generate a first error locator polynomial from the first syndrome 330. In one instance, the first error locator polynomial can be generated from the first instance of the BCH codeword using a BMA algorithm.

The error decoder 230 can determine if the first error locator polynomial indicates that the first instance of the codeword includes the predetermined number (t) of errors or less 340, thus indicating that the errors in the first instance of the codeword are potentially correctable. In one instance, the degree of the first error locator polynomial indicates how many errors are in the first instance of the codeword. The error decoder 230 can also determine the location of errors in the first instance of the codeword from the first error location polynomial, assuming the first error locator polynomial indicates that the first instance of the codeword includes t errors or less 360. In one instance, the location of the errors can be determined by a Chien Search on the first error location polynomial. Once the error locations have been determined, the error decoder 230 can correct the errors in the first instance of the codeword at the error locations 370. The corrected codeword can then be output by the error decoder to the memory controller.

However, when the error locator polynomial indicates that the codeword includes more than the predetermined number (t) of errors, the error decoder 230 can skip determining the location of errors using the Chien Search. The Chien Search takes a relatively large number of clock cycles to determine the location of errors. For example, if the error locating polynomial indicates that that a codeword includes 26 errors for a BCH codeword where t=26, it can take 31 clock cycles to detect the number of errors and 17 clock cycles to find the error locations, for a total of 48 clock cycles. If the error locating polynomial indicates that a codeword includes 27 errors, for example, the Chien Search can be skipped, thereby saving 17 clock cycles in the determination that the codeword is uncorrectable. Accordingly, the processing latency of correcting errors can be reduced by approximately 34%, particularly in situations where there is a high probability of errors.

When the error locator polynomial indicates that the first instance of the codeword is uncorrectable, the error detector 230 can output an indication of an uncorrectable codeword 350. In response, the memory controller 210 can send another read command to the memory device 220, and the memory cells can be sensed using a shifted Vdm to read out a second instance of the codeword, which is sent to the error decoder 230. Upon receiving the second instance of the codeword 310, the error decoder 230 can calculate a second syndrome of the second instance of the codeword 320. The error decoder 230 can also generate a second error locator polynomial from the second syndrome 330. Again, the second error locator polynomial can be generated from the second instance of the BCH codeword using the BMA algorithm.

The error decoder 230 can determine if the second error locator polynomial indicates that the second instance of the code-word includes the predetermined number (t) of errors or less 340. In one instance, the degree of the second error locator polynomial indicates how many errors are in the second instance of the codeword. The error decoder 230 can also determine the location of errors in the second instance of the codeword from the second error location polynomial when the second error locator polynomial indicates that the second instance of the codeword includes the predetermined number (t) of errors or less. In one instance, the location of the errors can be determined by a Chien Search on the second error location polynomial.

If, in this example, the first demarcation voltage was uncorrectable, the error detection for the first instance of the codeword can take 31 clock cycles. If the second instance of the codeword is correctable, the error detection for the second instance of the codeword can take 48 clock cycles, including the Chien search. In comparison, error detection using a Chien search for both the first and second instances can take 47 clock cycles for each BCH codeword, for a total of 94 clock cycles. Therefore, skipping the Chien Search for the first instance of the codeword can reduce the total number of clock cycles from 94 clock cycles to 79 clock cycles, which is a reduction of approximately 16% However, if the second error locator polynomial indicates that the second instance of the codeword is uncorrectable, the error detector 230 can again output an indication of an uncorrectable codeword, and a third instance of the codeword can be retrieved from the memory device 220.

Figure 4:
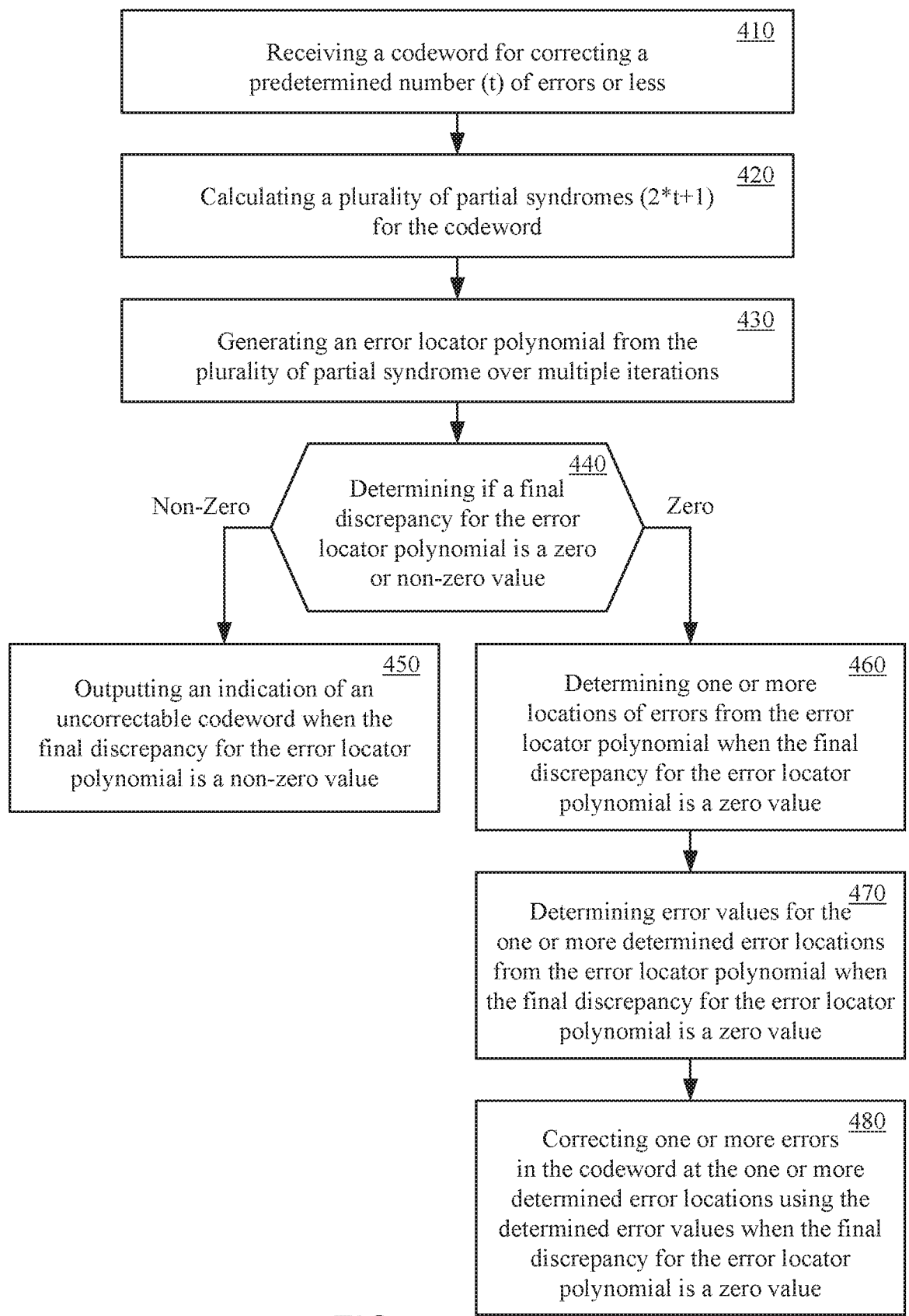
FIG. 4 is a flow diagram illustrating a method of reducing detection latency of uncorrectable errors in read data in accordance with an example.

FIG. 4 is a flow diagram illustrating a method of reducing detection latency of uncorrectable errors in read data in accordance with another example. In one example, codeword for correcting a predetermined number (t) of errors or less can be received 410. The codeword can include a plurality (2*t+1) of parity symbols. In one implementation the codeword can be a Reed-Solomon codeword for correcting the predetermined number (t) of errors or less. A plurality (2*t+1) of partial syndromes for the codeword can be calculated 420, and an error locator polynomial can be generated from the plurality (2*t+1) of partial syndromes over multiple iterations 430. In one implementation, the error locator polynomial can be generated using a Berlekamp-Massey Algorithm (BMA) on the plurality (2*t+1) of partial syndromes. A determination can be made if a final discrepancy for the error locator polynomial is a zero or non-zero value 440, where an indication of an uncorrectable codeword can be output when the final discrepancy for the error locator polynomial is a non-zero value 450.

In one example, a location of one or more errors can be determined from the error locator polynomial when the final discrepancy for the error locator polynomial is a zero value 460. In one implementation, determining the error locations can include determining the roots of the error locator polynomial using a Chien Search. The error values for the one or more error locations can be determined from the error locator polynomial when the final discrepancy for the error locator polynomial is a zero value 470. As such, errors in the codeword at the one or more determined error locations can be corrected using the determined error values when the final discrepancy for the error locator polynomial indicates is a zero value 480.

It should be noted that even when the final discrepancy for the error locator polynomial indicates is a zero value, the Reed-Solomon codeword may still be uncorrectable. However, the probability is equal to the probability that a random last discrepancy in the BMA is equal to 0. For a Galois Field (GF) of $2^m$, the probability of an uncorrectable error having an error locator polynomial with zero value final discrepancy is $2^{-m}$. For m=9, 99.8% of uncorrectable codewords can be detected by checking the polynomial degree.

The method of reducing detection latency of uncorrectable errors in read data will be further described referencing both FIGS. 2 and 4. In response to one or more read commands received front the memory controller 210, the memory device 220 can sense a specified set of memory cells (e.g., one or more word lines) using, for example, a first Vdm. The memory device 220 can output a first instance of the codeword sensed using the first Vdm. In one instance, the codeword can be a Reed-Solomon codeword including a plurality (2*t+1) of parity symbols for correcting up to the predetermined number (t) of errors. For example, the Reed-Solomon codeword can be used for correcting up to 25 errors, in a 1K byte codeword.

The error decoder 230 of the memory controller 210 can receive the first instance of the codeword 410, and can calculate a plurality (2*t+1) of partial syndromes for the first instance of the codeword 420. In one instance, the plurality (2*t+1) of partial syndromes can be calculated for the first instance of the Reed-Solomon codeword. The error decoder 230 can also generate a first error locator polynomial from the plurality (2*t+1) of partial syndromes over multiple iterations 430. In one instance, the first error locator polynomial can be generated from the plurality (2*t+1) of partial syndromes of the first instance of the Reed-Solomon codeword using the BMA algorithm.

The error decoder 230 can determine if a final discrepancy for the error locator polynomial is a zero or non-zero value 440. The error decoder 230 can determine the location of errors in the first instance of the codeword from the error locator polynomial when the final discrepancy for the error locator polynomial is a zero value 460. In one instance, the location of the errors can be determined by a Chien Search on the first error location polynomial. The error decoder 230 can determine error values for the one or more determined error locations from the error locator polynomial when the final discrepancy for the error locator polynomial is a zero value 470.

The error decoder 230 can correct one or more errors in the first instance of the codeword at the one or more determined error location using the determined error values when the final discrepancy for the error locator polynomial indicates is a zero value 480. The corrected codeword can then be output by the error decoder to the memory controller.

However, when the final discrepancy for the error locator polynomial is a non-zero value, the error decoder 230 can skip determining the location of errors using the Chien Search. The Chien Search takes a relatively large number of clock cycles to determine the location of errors. For example, if the error locating polynomial indicates that that the codeword includes 24 or less errors, for a Reed-Solomon codeword for correcting up to 25 errors, it can take 108 clock cycles to detect correctable errors. If the error locating polynomial indicates that the codeword includes 25 or more errors, the Chien Search can be skipped, and therefore it can take 50 clock cycles to determine that the codeword contains uncorrectable errors. Accordingly, the processing latency of correcting errors can be reduced by approximately 53% when there is a high probability that the first demarcation voltage is unsuitable. In comparison, it can take one additional clock cycle to detect error using a BCH codeword used for correcting 24 errors as compared to correcting 25 errors, which is an increase of approximately 1%.

When the first error locator polynomial indicates that the final discrepancy for the error locator polynomial is a non-zero value, the error detector 230 can output an indication of an uncorrectable codeword 450. In response to the indication that the first instance of the codeword includes uncorrectable errors, the memory controller 210 can generate corresponding read commands. In response to the read commands, the memory device 220 can sense the specified set of memory cells using a second demarcation voltage and output a second instance of the codeword to the error decoder 230. In one instance, the second demarcation voltage can be shifted higher or lower from the first demarcation voltage.

Upon receiving the second instance of the codeword 310, the error decoder 230 can calculate a second plurality (2*t+1) of partial syndromes for the codeword 420. Again, second plurality (2*t+1) of partial syndromes can be calculated for the second instance of the Reed-Solomon codeword. The error decoder 230 can also generate a second error locator polynomial from the second plurality of partial syndromes (2*t+1) over multiple iterations 430. Again, the second error locator polynomial can be generated from the second instance of the Reed-Solomon codeword using the BMA algorithm.

The error decoder 230 can determine if a final discrepancy for the second error locator polynomial is a zero or non-zero value 440. The error decoder 230 can determine the location of errors locations of errors from the second error locator polynomial when the second final discrepancy for the second error locator polynomial is a zero value. In one instance, the location of the errors can be determined by a Chien Search on the second error location polynomial. The error decoder 230 can also determine error values for the one or more determined error locations from the second error locator polynomial when the final discrepancy value for the second error locator polynomial is a zero value If, in this example, the first demarcation voltage was unsuitable and therefore the first instance of the Reed-Solomon codeword includes uncorrectable error, the error detection for the first instance of the codeword can take 50 clock cycles. If the final discrepancy value for the second error locator polynomial is a zero value, the error detection for the second instance of the codeword can take 108 clock cycles. In comparison, the error detection according the traditional process using the Chien search can take 107 clock cycles for the first instance and 107 clock cycles for the second instance of the Reed-Solomon codeword. Therefore, skipping the Chien Search for the first instance of the codeword when the second final discrepancy for the second error locator polynomial indicates is a non-zero value can reduce the total number of clock cycles for processing both the first and second instance of the Reed-Solomon codeword from 214 clock cycles to 158 clock cycles, which is a reduction of approximately 26%.

However, if the second final discrepancy for the second error locator polynomial indicates is a non-zero value, the error detector can again output an indication of an uncorrectable codeword. The memory device can then output another instance of the codeword for processing by the error detector 230.

Embodiments advantageously reduce processing latency when there is a high probability that the first demarcation voltage is unsuitable for sensing the state of the memory cells, and correspondingly there can be a high probability of uncorrectable codeword. Latency can be reduced by detecting an uncorrectable codeword before performing a Chien Search. In the case of BCH codeword, the latency reduction can be achieved by adding additional parity bits to design a BCH code to correct an additional error. In the case of Reed-Solomon codeword, the latency reduction can be achieved by adding one additional parity symbol to the codeword.

Figure 5:
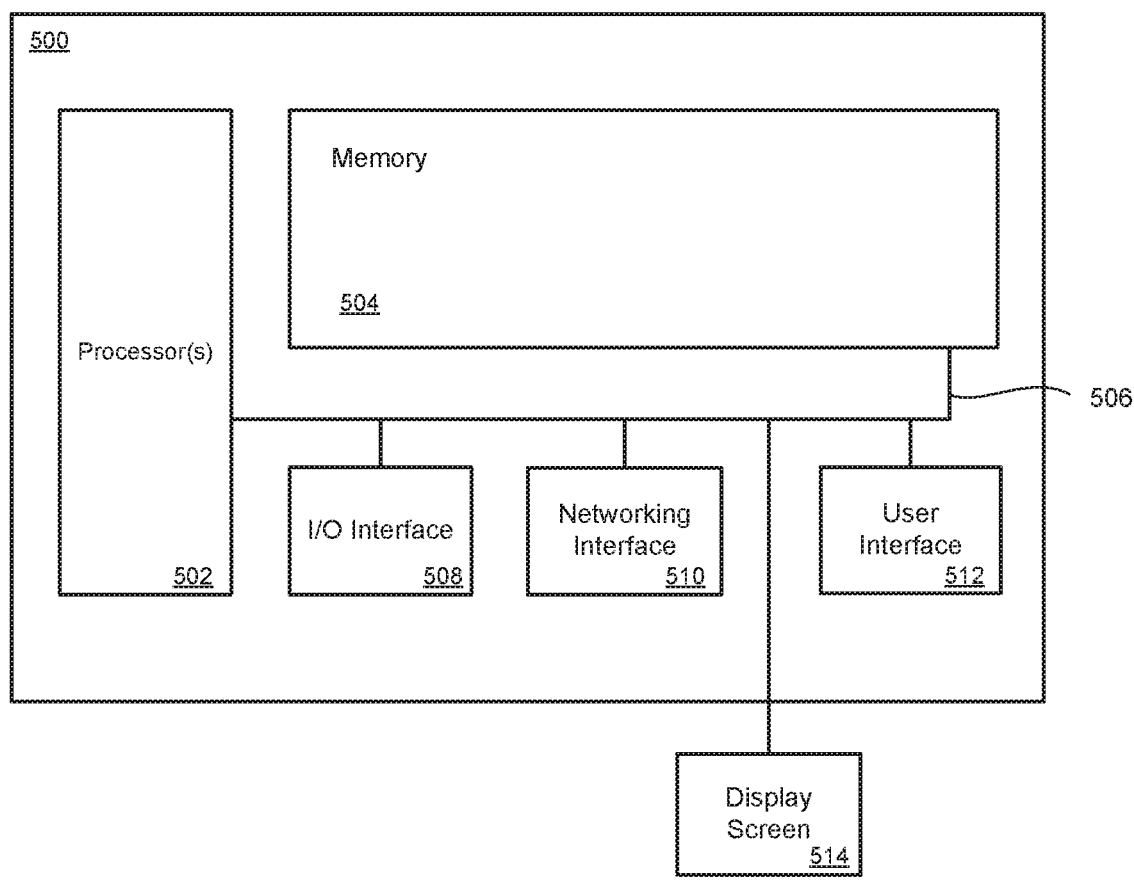
FIG. 5 is a block diagram illustrating a computing system in accordance with an example.

As another example, FIG. 5 illustrates a general example of a computing system or device that can incorporate the present technology. While any type or configuration of device or computing system that utilizes an appropriate error correction technology is contemplated to be within the present scope, non-limiting examples can include node computing systems, system-on-chip (SoC) systems, system-in-package (SiP) systems, system-on-package (SoP) systems, server systems, networking systems, high capacity computing systems, laptop computers, tablet computers, desktop computers, smart phones, and the like.

The computing system 500 can include one or more processors 502 including a single core or multiple processor cores. The processor 502 is in communication with a memory 504, which can include any device, combination of devices, circuitry, or the like, which is capable of storing, accessing, organizing, and/or retrieving data. Non-limiting examples include SANs (Storage Area Network), cloud storage networks, volatile or non-volatile RAM, NVM storage, solid state memory, phase change memory, optical media, hard-drive type media, and the like, including combinations thereof. Additionally, a communication interface 506, such as a local communication interface, for example, provides connectivity between the various components of the system. The communication interface 506 can vary widely depending on the processor, chipset, and memory architectures of the system. For example, the communication interface 506 can be a local data bus, command/address bus, package interface, or the like. In some examples, the communication interface 506 can be a separate interface between the processor 502 and one or more other components of the system, such as, for example, the memory 504. The memory 504 can include system memory that is volatile, nonvolatile, or a combination thereof, as described herein. The memory 504 can additionally include NVM utilized as a memory store.

The computing system can also include an I/O (input/output) interface 508 for controlling the I/O functions of the system, as well as for I/O connectivity to devices outside of the computing system. A network interface 510 can also be included for network connectivity. The network interface 510 can control network communications both within the system and outside of the system, and can include a wired interface, a wireless interface, a Bluetooth interface, optical interface, communication fabric, and the like, including appropriate combinations thereof. Furthermore, the computing system can additionally include a user interface 512, a display device 514, as well as various other components that would be beneficial for such a system.

Various techniques, or certain aspects or portions thereof, can take the form of program code (i.e., instructions) embodied in tangible media, such as CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data.

EXAMPLES

The following examples pertain to specific technology embodiments and point out specific features, elements, or steps that may be used or otherwise combined in achieving such embodiments.

In one example, there is provided an error correction device, comprising a memory controller configured to receive a codeword from a memory device, wherein the codeword is configured to correct a predetermined number (t) of errors or less, generate an error locator polynomial from the codeword, determine if the codeword includes more than the predetermined number of errors (t+1 or greater) from the error locator polynomial, and output an indication of an uncorrectable codeword when the error locator polynomial indicates that the codeword includes more than the predetermined number of errors without determining error locations.

In one example of the device, when the error locator polynomial indicates that the codeword includes the predetermined number of errors or less, the memory controller is further configured to determine one or more locations of errors in the codeword from the error locator polynomial and correct one or more errors in the codeword at the one or more determined error locations.

In one example of the device, to determine the one or more locations of errors in the codeword from the error locator polynomial, the memory controller is further configured to determine roots of the error locator polynomial using a Chien Search.

In one example of the device, to generate the error locator polynomial from the codeword, the memory controller is further configured to calculate a syndrome for the codeword and generate the error locator polynomial from the syndrome.

In one example of the device, the codeword comprises a Bose-Chaudhure-Hocquenghem codeword for correcting the predetermined number (t) of errors.

In one example of the device, the memory controller is further configured to generate the error locator polynomial using a Berlekamp-Massey Algorithm (BMA) on the syndrome.

In one example of the device, in determining if the codeword includes more than the predetermined number of errors (t+1 or greater), the memory controller is further configured to determine a degree of the error locator polynomial and determine that the codeword includes more than the predetermined number of errors t+1 or greater) when the degree of the error locator polynomial is greater than the predetermined number of errors.

In one example of the device, to generate the error locator polynomial from the codeword, the memory controller is further configured to receive, along with the codeword from the memory device, a plurality (2*t+1) of parity symbols for correcting the predetermined number (t) of errors or less, calculate a plurality (2*t+1) of partial syndromes for the codeword, and generate the locator polynomial from the plurality (2*t+1) of partial syndromes over multiple iterations.

In one example of the device, to determine if the codeword includes more than the predetermined number of errors (t+1 or greater), the memory controller is further configured to determine if a final discrepancy for the error locator polynomial is a zero or non-zero value and output the indication of an uncorrectable codeword when the final discrepancy for the error locator polynomial is a non-zero value without determining error locations.

In one example of the device, the codeword comprises a Reed-Solomon codeword for correcting the predetermined number (t) or less of errors.

In one example of the device, to generate the error locator polynomial from the plurality (2*t+1) of partial syndromes, the memory controller is further configured to generate the error locator polynomial using a Berlekamp-Massey Algorithm (BMA) on the plurality (2*t+1) of partial syndromes.

In one example of the device, to determine if a final discrepancy for the error locator polynomial is a zero or non-zero value, the memory controller is further configured to determine if a result of a last iteration of the BMA on the plurality (2*t+1) of partial syndromes is zero or non-zero.

In one example, there is provided a computing system, comprising a host processor, a memory device, a memory controller communicatively coupled to the host processor and the memory device, the memory controller configured to receive a codeword from the memory device in response to a read request from the host processor, wherein the codeword is configured to correct a predetermined number (t) of errors or less, generate an error locator polynomial from the codeword, determine if the codeword includes more than the predetermined number of errors (t+1 or greater) from the error locator polynomial, and output an indication of an uncorrectable codeword when the error locator polynomial indicates that the codeword includes more than the predetermined number of errors without determining error locations.

In one example of the system, when the error locator polynomial indicates that the codeword includes the predetermined number of errors or less, the memory controller is further configured to determine one or more locations of errors in the codeword from the error locator polynomial and correct one or more errors in the codeword at the one or more determined error locations.

In one example of the system, to determine the one or more locations of errors in the codeword from the error locator polynomial, the memory controller is further configured to determine roots of the error locator polynomial using a Chien Search.

In one example of the system, to generate the error locator polynomial from the codeword, the memory controller is further configured to calculate a syndrome for the codeword and generate the error locator polynomial from the syndrome.

In one example of the system, the codeword comprises a Bose-Chaudhure-Hocquenghem codeword for correcting the predetermined number (t) of errors.

In one example of the system, the memory controller is further configured to generate the error locator polynomial using a Berlekamp-Massey Algorithm (BMA) on the syndrome.

In one example of the system, in determining if the codeword includes more than the predetermined number of errors (t+1 or greater), the memory controller is further configured to determine a degree of the error locator polynomial and determine that the codeword includes more than the predetermined number of errors (t+1 or greater) when the degree of the error locator polynomial is greater than the predetermined number of errors.

In one example of the system, to generate the error locator polynomial from the codeword, the memory controller is further configured to receive, along with the codeword from the memory device, a plurality (2*t+1) of parity symbols for correcting the predetermined number (t) of errors or less, calculate a plurality (2*t+1) of partial syndromes for the codeword, and generate the locator polynomial from the plurality (2*t+1) of partial syndromes over multiple iterations.

In one example of the system, to determine if the codeword includes more than the predetermined number of errors (t+1 or greater), the memory controller is further configured to determine if a final discrepancy for the error locator polynomial is a zero or non-zero value and output the indication of an uncorrectable codeword when the final discrepancy for the error locator polynomial is a non-zero value, without determining error locations.

In one example of the system, the codeword comprises a Reed-Solomon codeword for correcting the predetermined number (t) or less of errors.

In one example of the system, to generate the error locator polynomial from the plurality (2*t+1) of partial syndromes, the memory controller is further configured to generate the error locator polynomial using a Berlekamp-Massey Algorithm (BMA) on the plurality (2*t+1) of partial syndromes.

In one example of the system, to determine if a final discrepancy for the error locator polynomial is a zero or non-zero value, the memory controller is further configured to determine if a result of a last iteration of the BMA on the plurality (2*t+1) of partial syndromes is zero or non-zero.

In one example of the system, the memory device comprises a resistive cell array.

In one example of the system, the memory device comprises a phase change cell array.

In one example of the system, the memory device comprises a phase change cell array and a stackable cross-gridded data access array.

In one example of the system, the memory device comprises a spin torque magnetoresistive cell array.

In one example, there is provided a method of reducing detection latency of uncorrectable errors in read data, comprising receiving a codeword at a memory controller from a memory device, wherein the codeword is configured to correct a predetermined number (t) of errors or less, generating, in an error decoder of the memory controller, an error locator polynomial from the codeword, determining, in the error decoder, if the codeword includes more than the predetermined number of errors (t+1 or greater) from the error locator polynomial, outputting, from the memory controller, an indication of an uncorrectable codeword when the error locator polynomial indicates that the codeword includes more than the predetermined number of errors without determining error locations, and receiving a subsequent copy of the codeword at the memory controller from the memory device in response to the indication of an uncorrectable codeword.

In one example of the method, when the error locator polynomial indicates that the codeword includes the predetermined number of errors or less, the method further comprises determining one or more locations of errors in the codeword from the error locator polynomial and correcting one or more errors in the codeword at the one or more determined error locations.

In one example of the method, in determining the one or more locations of errors in the codeword from the error locator polynomial, the method further comprises determining roots of the error locator polynomial using a Chien Search.

In one example of the method, to generate the error locator polynomial from the codeword, the method further comprises calculating a syndrome for the codeword and generating the error locator polynomial from the syndrome.

In one example of the method, the codeword comprises a Bose-Chaudhure-Hocquenghem codeword for correcting the predetermined number (t) of errors.

In one example, the method further comprises generating the error locator polynomial using a Berlekamp-Massey Algorithm (BMA) on the syndrome.

In one example of the method, in determining if the codeword includes more than the predetermined number of errors (t+1 or greater), the method further comprises determining a degree of the error locator polynomial and determining that the codeword includes more than the predetermined number of errors (t+1 or greater) when the degree of the error locator polynomial is greater than the predetermined number of errors.

In one example of the method, to generate the error locator polynomial from the codeword, the method further comprises receiving, along with the codeword from the memory device, a plurality (2*t+1) of party symbols for correcting the predetermined number (t) of errors or less, calculating a plurality (2*t+1) of partial syndromes for the codeword, and generating the locator polynomial from the plurality (2*t+1) of partial syndromes over multiple iterations.

In one example of the method, to determine if the codeword includes more than the predetermined number of errors (t+1 or greater), the method further comprises determining if a final discrepancy for the error locator polynomial is a zero or non-zero value and outputting, from the memory controller, the indication of an uncorrectable codeword when the final discrepancy for the error locator polynomial is a non-zero value, without determining error locations.

In one example of the method, the codeword comprises a Reed-Solomon codeword for correcting the predetermined number (t) or less of errors.

In one example of the method, to generate the error locator polynomial from the plurality (2*t+1) of partial syndromes, the method further comprises generating the error locator polynomial using a Berlekamp-Massey Algorithm (BMA) on the plurality (2*t+1) of partial syndromes.

In one example of the method, to determine if a final discrepancy for the error locator polynomial is a zero or non-zero value, the method further comprises determining if a result of a last iteration of the BMA on the plurality (2*t+1) of partial syndromes is zero or non-zero.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

What is claimed is:

1. An error correction device, comprising:
    a memory controller configured to:
        receive a codeword from a memory device, wherein the codeword is configured to correct a predetermined number (t) of errors or less;
        generate an error locator polynomial from the codeword;
        determine if the codeword includes more than the predetermined number of errors (t+1 or greater) from the error locator polynomial; and
        output an indication of an uncorrectable codeword when the error locator polynomial indicates that the codeword includes more than the predetermined number of errors without determining error locations.

2. The device of claim 1, wherein, when the error locator polynomial indicates that the codeword includes the predetermined number of errors or less, the memory controller is further configured to:
determine one or more locations of errors in the codeword from the error locator polynomial; and
correct one or more errors in the codeword at the one or more determined error locations.

3. The device of claim 2, wherein, to determine the one or more locations of errors in the codeword from the error locator polynomial, the memory controller is further configured to determine roots of the error locator polynomial using a Chien Search.

4. The device of claim 1, wherein, to generate the error locator polynomial from the codeword, the memory controller is further configured to:
calculate a syndrome for the codeword, wherein the codeword is a Bose-Chaudhure-Hocquenghem codeword; and
generate the error locator polynomial by applying a Berlekamp-Massey Algorithm (BMA) to the syndrome.

5. The device of claim 4, wherein, in determining if the codeword includes more than the predetermined number of errors (t+1 or greater), the memory controller is further configured to:
determine a degree of the error locator polynomial; and
determine that the codeword includes more than the predetermined number of errors (t+1 or greater) when the degree of the error locator polynomial is greater than the predetermined number of errors.

6. The device of claim 1, wherein, to generate the error locator polynomial from the codeword, the memory controller is further configured to:
receive, along with the codeword from the memory device, a plurality (2*t+1) of parity symbols for correcting the predetermined number (t) of errors or less;
calculate a plurality (2*t+1) of partial syndromes for the codeword; and
generate the locator polynomial from the plurality (2*t+1) of partial syndromes over multiple iterations.

7. The device of claim 6, wherein, to determine if the codeword includes more than the predetermined number of errors (t+1 or greater), the memory controller is further configured to:
determine if a final discrepancy for the error locator polynomial is a zero or non-zero value; and
output the indication of an uncorrectable codeword when the final discrepancy for the error locator polynomial is a non-zero value without determining error locations, wherein the codeword is a Reed-Solomon codeword.

8. The device of claim 6, wherein, to generate the error locator polynomial from the plurality (2*t+1) of partial syndromes, the memory controller is further configured to generate the error locator polynomial using a Berlekamp-Massey Algorithm (BMA) on the plurality (2*t+1) of partial syndromes; and
to determine if a final discrepancy for the error locator polynomial is a zero or non-zero value, the memory controller is further configured to determine if a result of a last iteration of the BMA on the plurality (2*t+1) of partial syndromes is zero or non-zero.

9. A computing system, comprising:
a host processor;
a memory device;
a memory controller communicatively coupled to the host processor and the memory device, the memory controller configured to:
receive a codeword from the memory device in response to a read request from the host processor, wherein the codeword is configured to correct a predetermined number (t) of errors or less;
generate an error locator polynomial from the codeword;
determine if the codeword includes more than the predetermined number of errors (t+1 or greater) from the error locator polynomial; and
output an indication of an uncorrectable codeword when the error locator polynomial indicates that the codeword includes more than the predetermined number of errors without determining error locations.

10. The system of claim 9, wherein, when the error locator polynomial indicates that the codeword includes the predetermined number of errors or less, the memory controller is further configured to:
determine one or more locations of errors in the codeword from the error locator polynomial; and
correct one or more errors in the codeword at the one or more determined error locations.

11. The system of claim 10, wherein, to determine the one or more locations of errors in the codeword from the error locator polynomial, the memory controller is further configured to determine roots of the error locator polynomial using a Chien Search.

12. The system of claim 9, wherein, to generate the error locator polynomial from the codeword, the memory controller is further configured to:
calculate a syndrome for the codeword, wherein the codeword is a Bose-Chaudhure-Hocquenghem codeword; and
generate the error locator polynomial from the syndrome by applying a Berlekamp-Massey Algorithm (BMA) to the syndrome.

13. The system of claim 12, wherein, in determining if the codeword includes more than the predetermined number of errors (t+1 or greater), the memory controller is further configured to:
determine a degree of the error locator polynomial; and
determine that the codeword includes more than the predetermined number of errors (t+1 or greater) when the degree of the error locator polynomial is greater than the predetermined number of errors.

14. The system of claim 9, wherein, to generate the error locator polynomial from the codeword, the memory controller is further configured to:
receive, along with the codeword from the memory device, a plurality (2*t+1) of parity symbols for correcting the predetermined number (t) of errors or less;
calculate a plurality (2*t+1) of partial syndromes for the codeword; and
generate the locator polynomial from the plurality (2*t+1) of partial syndromes over multiple iterations.

15. The system of claim 14, wherein, to determine if the codeword includes more than the predetermined number of errors (t+1 or greater), the memory controller is further configured to:
determine if a final discrepancy for the error locator polynomial is a zero or non-zero value; and
output the indication of an uncorrectable codeword when the final discrepancy for the error locator polynomial is a non-zero value, without determining error locations, wherein the codeword is a Reed-Solomon codeword.

16. The system of claim 14, wherein, to generate the error locator polynomial from the plurality (2*t+1) of partial syndromes, the memory controller is further configured to generate the error locator polynomial using a Berlekamp-Massey Algorithm (BMA) on the plurality (2*t+1) of partial syndromes; and
to determine if a final discrepancy for the error locator polynomial is a zero or non-zero value, the memory controller is further configured to determine if a result of a last iteration of the BMA on the plurality (2*t+1) of partial syndromes is zero or non-zero.

17. A method of reducing detection latency of uncorrectable errors in read data, comprising:
receiving a codeword at a memory controller from a memory device, wherein the codeword is configured to correct a predetermined number (t) of errors or less;
generating, in an error decoder of the memory controller, an error locator polynomial from the codeword;
determining, in the error decoder, if the codeword includes more than the predetermined number of errors (t+1 or greater) from the error locator polynomial;
outputting, from the memory controller, an indication of an uncorrectable codeword when the error locator polynomial indicates that the codeword includes more than the predetermined number of errors without determining error locations; and
receiving a subsequent copy of the codeword at the memory controller from the memory device in response to the indication of an uncorrectable codeword.

18. The method of claim 17, wherein, when the error locator polynomial indicates that the codeword includes the predetermined number of errors or less, the method further comprises:
determining one or more locations of errors in the codeword from the error locator polynomial; and
correcting one or more errors in the codeword at the one or more determined error locations.

19. The method of claim 18, wherein, in determining the one or more locations of errors in the codeword from the error locator polynomial, the method further comprises determining roots of the error locator polynomial using a Chien Search.

20. The method of claim 17, wherein, to generate the error locator polynomial from the codeword, the method further comprises:
calculating a syndrome for the codeword, wherein the codeword is a Bose-Chaudhure-Hocquenghem codeword; and
generating the error locator polynomial from the syndrome by applying a Berlekamp-Massey Algorithm (BMA) to the syndrome.

21. The method of claim 20, wherein, in determining if the codeword includes more than the predetermined number of errors (t+1 or greater), the method further comprises:
determining a degree of the error locator polynomial; and
determining that the codeword includes more than the predetermined number of errors (t+1 or greater) when the degree of the error locator polynomial is greater than the predetermined number of errors.

22. The method of claim 17, wherein, to generate the error locator polynomial from the codeword, the method further comprises:
receiving, along with the codeword from the memory device, a plurality (2*t+1) of parity symbols for correcting the predetermined number (t) of errors or less;
calculating a plurality (2*t+1) of partial syndromes for the codeword; and
generating the locator polynomial from the plurality (2*t+1) of partial syndromes over multiple iterations.

23. The method of claim 22, wherein, to determine if the codeword includes more than the predetermined number of errors (t+1 or greater), the method further comprises:
determining if a final discrepancy for the error locator polynomial is a zero or non-zero value; and
outputting, from the memory controller, the indication of an uncorrectable codeword when the final discrepancy for the error locator polynomial is a non-zero value, without determining error locations, wherein the codeword comprises a Reed-Solomon codeword.

24. The method of claim 22, wherein, to generate the error locator polynomial from the plurality (2*t+1) of partial syndromes, the method further comprises generating the error locator polynomial using a Berlekamp-Massey Algorithm (BMA) on the plurality (2*t+1) of partial syndromes; and
to determine if a final discrepancy for the error locator polynomial is a zero or non-zero value, the method further comprises determining if a result of a last iteration of the BMA on the plurality (2*t+1) of partial syndromes is zero or non-zero.

* * * * *